United States Patent

Liu

[11] Patent Number: 5,114,036
[45] Date of Patent: May 19, 1992

[54] COVERING PLATE FOR A PRESET HOLE ON A COMPUTER HOUSING

[75] Inventor: Chi Liu, Taoyuan, Taiwan
[73] Assignee: Enlight Corporation, Taoyuan, Taiwan
[21] Appl. No.: 583,724
[22] Filed: Sep. 14, 1990
[51] Int. Cl.$^5$ .................... B65D 45/22; H05K 7/00
[52] U.S. Cl. ................................ 220/307; D8/353; 361/380
[58] Field of Search .............. 220/242, 307; D8/349, D8/350, 353, 354; 174/35 GC, 65 R; 361/356, 392, 424, 426

[56] References Cited

U.S. PATENT DOCUMENTS

| | | | |
|---|---|---|---|
| 1,800,173 | 4/1931 | Anderson | 220/307 |
| 2,497,827 | 2/1950 | Trafton | 220/307 |
| 2,527,053 | 10/1950 | Bradford, Jr. | 220/307 X |
| 2,552,917 | 5/1951 | Becker | 220/307 |
| 3,743,892 | 7/1973 | Fritz et al. | 220/242 X |
| 3,783,175 | 1/1974 | Timmons | 174/65 R X |
| 3,990,604 | 11/1976 | Barnett et al. | 220/307 |
| 4,076,364 | 2/1978 | Kuo | 174/65 R X |
| 4,091,842 | 5/1978 | Greenawalt | 220/307 X |
| 4,091,962 | 5/1978 | van Buren, Jr. | 220/307 X |
| 4,588,105 | 5/1986 | Schmitz et al. | 220/307 X |
| 4,832,234 | 5/1989 | Peterson | 220/307 X |

Primary Examiner—Leo P. Picard
Assistant Examiner—Michael W. Phillips
Attorney, Agent, or Firm—Ladas & Parry

[57] ABSTRACT

A removable covering plate for a hole in a computer housing is substantially rectangular with outwardly protruding elements formed along the edges of the plate. The leading edges of the individual elements are bent towards the central axis of the covering plate. The covering plate can be fastened to a hole in a computer housing with the protruding elements in engagement with the edges of the hole.

2 Claims, 2 Drawing Sheets

COVERING PLATE FOR A PRESET HOLE ON A COMPUTER HOUSING

BACKGROUND OF THE INVENTION

The present invention relates to a covering plate which is substantially a rectangular plate 11 having depressions formed on both the longer sides thereof. The covering plate is used to temporarily cover a hole for cable/wire connections in a computer housing.

In order to reserve the connection of cables/wires to a Computer Processing Unit (CPU), holes are usually provided through the housing of the computer to facilitate external connection of cables. Before the hole is used, a covering plate is employed to cover up the hole. The covering of the hole is usually done by screwing a plate onto the housing having the same size and shape as the hole. However, this operation is rather troublesome and time consuming. Therefore, the present invention provides a covering plate which can be easily mounted onto or dislocated from the housing.

SUMMARY OF THE INVENTION

Accordingly, it is an object of the present invention to provide a covering plate for a hole in a computer housing that can be easily inserted into the hole and secured tightly to the edges of the hole.

It is another object of the present invention to provide a covering plate for a hole in a computer housing, which covering plate provides a plurality of elements that are elastically disposed within the edges of the hole.

It is yet another object of the present invention to provide a covering plate for a hole in a computer housing, which covering plate is readily attached to the hole.

These and other objects, advantages and features of the present invention will be more fully understood and appreciated by reference to the written specification.

BRIEF DESCRIPTION OF THE DRAWINGS

The present invention will be further explained with reference to the annexed drawings, wherein.

DETAILED DESCRIPTION OF THE INVENTION

While this specification concludes with claims particularly pointing out and distinctly claiming that which is considered to be the invention, it is believed that the invention can be better understood from a reading of the following detailed description of the invention and the appended examples.

Figure 1:
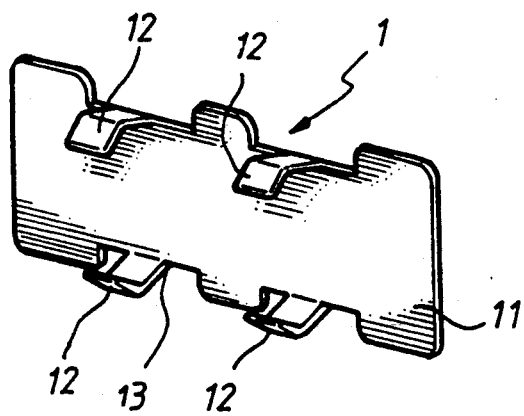
FIG. 1 is a perspective view of the covering plate in accordance with the present invention.

Referring to FIG. 1, a covering plate 1 is substantially a rectangular plate 11 having depressions or slots formed on the longer sides thereof. A plurality of protruding elements 12 having a base portion 13 are disposed at the bottom of the depression of the longer sides of the rectangular plate 11. These protruding elements 12 are slightly divergently bent away from a perpendicular to the plane of the plate at the point of attachment of the elements at the bottoms of the depressions. The protruding elements 12 are formed corresponding to each other at the longer sides of the rectangular plate 11. The leading ends of the protruding elements 12 are bent in towards the central axis of the rectangular plate 11.

Figure 2:
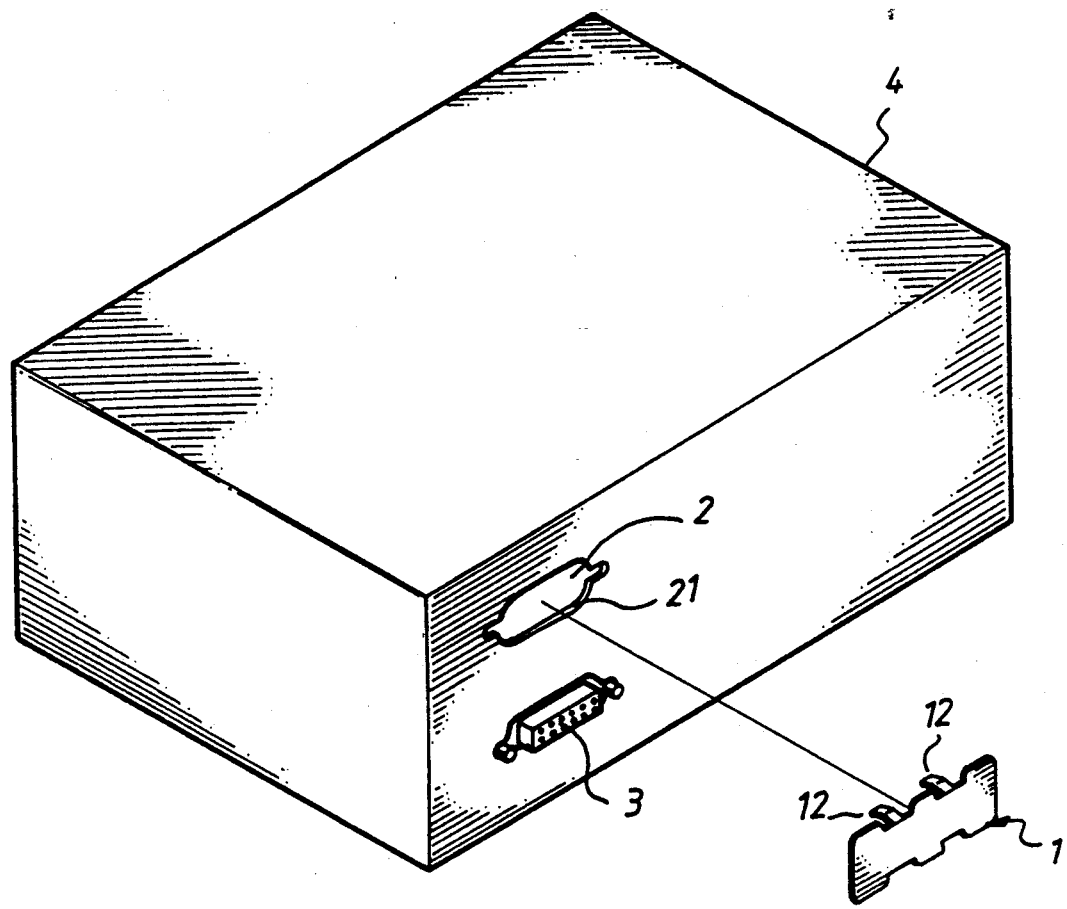
FIG. 2 is a schematic view of the preferred embodiment in accordance with the present invention.
Figure 3:
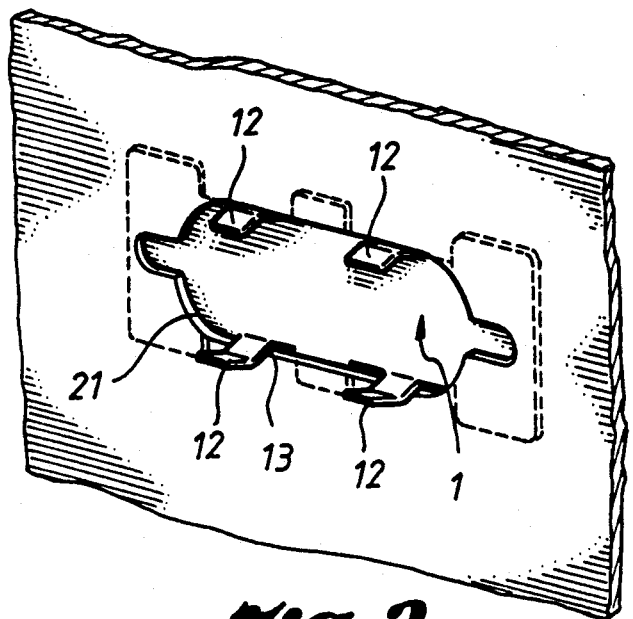
FIG. 3 is a perspective view showing the full insertion of the covering plate into a hole in a housing.
Figure 4:
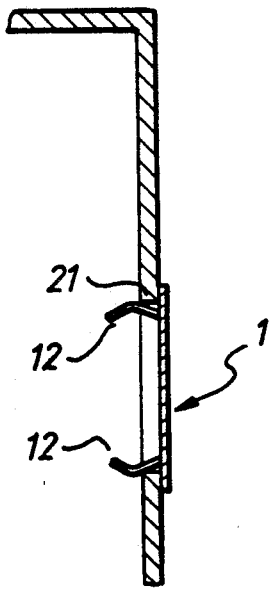
FIG. 4 is a cross-sectional view showing the engagement of the covering plate with the hole.

Referring to FIG. 2, a hole 2 which may be of various shapes and sizes is formed on the housing 4 of a personal computer. As shown in FIGS. 2, 3, and 4, when the covering plate 1 is mounted on the hole 2, the base section 13 thereof can be exactly fixed against the edge 21 of the hole 2.

Owing to the protruding elements 12 having elasticity and inwardly bent leading ends, as the covering plate 1 is engaged with the hole 2, the protruding elements 12 are easily inserted into the hole. After the covering plate 1 has been fully inserted into the hole 2, the protrusions are pressed against edges 21 the of hole 2 due to the elasticity of the protruding elements 12.

As shown in FIG. 2, if wire connectors 3 are to be connected, the housing 4 of the personal computer is opened, the protruding elements 12 within the housing 4 are pressed toward each other by hand or with tools (not shown), and the covering plate 1 is thus easily dislocated from the outside of the housing 1.

While only one embodiment of the present invention has been shown and described herein, it will be appreciated that modifications thereof, some of which have been alluded to hereinabove, may still be readily made thereto by those skilled in the art. We, therefore, intend by the appended claims to cover the modifications alluded to herein as well as all other modifications which fall within the true spirit and scope of our invention.

I claim:

1. A covering plate for insertion into an aperture in a computer housing, the aperture being defined by edges of a wall of the housing, the covering plate comprising:

a substantially flat plate having a pair of depressions in each of oppositely disposed sides of the plate, each of said depressions including bottom and side walls lying within the plane of said flat plate; and four protruding resilient elements each having a leading end and a rear end, said ends extending from the bottom wall of respective ones of said depressions, each of said elements extending in a direction substantially perpendicular to and slightly inclined towards the side walls of the depression from which each said element extends, each of said elements being bent at a point intermediate the leading and rear ends thereof so that leading end portions of the elements extending from depressions in one of said oppositely disposed sides extend in a direction towards the other of said sides;

whereby, during the insertion of said covering plate into an aperture, the element leading end portions engage edges of the aperture and are thereby inwardly moved until the point at which the elements are bent is inserted into the aperture beyond the edges thereof whereupon the elements spring outwardly to clamp edges of the covering plate between the rear ends of the elements and the depression side walls.

2. A covering plate according to claim 1 wherein said elements are integral with said flat plate.

* * * * *